(12) United States Patent
Gallup et al.

(10) Patent No.: US 7,534,636 B2
(45) Date of Patent: May 19, 2009

(54) LIDS FOR WAFER-SCALE OPTOELECTRONIC PACKAGES

(75) Inventors: Kendra J. Gallup, Sunnyvale, CA (US); James A. Matthews, Milpitas, CA (US); Martha Johnson, Greeley, CO (US)

(73) Assignee: Avago Technologies Fiber IP (Singapore) Pte. Ltd., Singapore (SG)

( * ) Notice: Subject to any disclaimer, the term of this patent is extended or adjusted under 35 U.S.C. 154(b) by 258 days.

(21) Appl. No.: 11/097,534

(22) Filed: Mar. 31, 2005

(65) Prior Publication Data

US 2005/0285131 A1  Dec. 29, 2005

Related U.S. Application Data

(62) Division of application No. 10/877,615, filed on Jun. 24, 2004, now Pat. No. 7,045,827.

(51) Int. Cl.
*H01L 33/00* (2006.01)
(52) U.S. Cl. .............. 438/27; 438/125; 257/98; 257/99; 257/704; 257/E33.058
(58) Field of Classification Search ........... 438/125, 438/27; 257/98–100, 704
See application file for complete search history.

(56) References Cited

U.S. PATENT DOCUMENTS

| | | | |
|---|---|---|---|
| 3,657,029 A * | 4/1972 | Fuller | 438/625 |
| 4,773,972 A | 9/1988 | Mikkor | |
| 4,791,075 A * | 12/1988 | Lin | 29/837 |
| 5,336,928 A * | 8/1994 | Neugebauer et al. | 257/758 |
| 5,500,540 A | 3/1996 | Jewell et al. | |
| 6,062,461 A | 5/2000 | Sparks et al. | |
| 6,130,107 A | 10/2000 | Brady et al. | |
| 6,487,224 B1 | 11/2002 | Ohashi et al. | |
| 6,696,645 B2 | 2/2004 | Margomenos et al. | |
| 2003/0071283 A1* | 4/2003 | Heschel | 257/200 |
| 2004/0087043 A1 | 5/2004 | Lee et al. | |
| 2005/0063648 A1* | 3/2005 | Wilson et al. | 385/90 |
| 2005/0111797 A1* | 5/2005 | Sherrer et al. | 385/93 |
| 2005/0124159 A1* | 6/2005 | Kalvesten et al. | 438/689 |
| 2005/0265722 A1* | 12/2005 | Gallup et al. | 398/101 |
| 2007/0228576 A1* | 10/2007 | Trezza | 257/774 |

OTHER PUBLICATIONS

German Office Action dated Mar. 1, 2007; Involving counterpart German Patent Application No. 10 2005 010 926.8-33.
English translation of German Office Action dated Mar. 1, 2007 involving German Patent Application No. 10 2005 010 926.8-33.

* cited by examiner

*Primary Examiner*—A. Sefer

(57) ABSTRACT

A method for forming a lid for a wafer-scale package includes (1) forming a cavity in a substrate, (2) forming an oxide layer over the cavity and over a bond area around the cavity on the substrate, (3) forming a reflective layer over the oxide layer, (4) forming a barrier layer over the reflective layer, (5) etching a portion of the barrier layer down to a portion of the reflective layer over the bond area, and (6) forming a solder layer on the portion of the reflective layer. The reflective layer can be a titanium-platinum-gold metal stack and the barrier layer can be a titanium dioxide layer.

18 Claims, 11 Drawing Sheets

LIDS FOR WAFER-SCALE OPTOELECTRONIC PACKAGES

This is a Divisional of application Ser. No. 10/877,615, filed on Jun. 24, 2004 now U.S. Pat. No. 7,045,827, the entire disclosure of which is incorporated herein by reference.

FIELD OF INVENTION

This invention relates to a method for creating a wafer of lids for wafer-scale optoelectronic packages.

DESCRIPTION OF RELATED ART

Optoelectronic (OE) devices are generally packaged as individual die. This means of assembly is often slow and labor intensive, resulting in higher product cost. Thus, what is needed is a method to improve the packaging of OE devices.

SUMMARY

In one embodiment of the invention, a method for forming a lid for a wafer-scale package includes (1) forming a cavity in a substrate, (2) forming an oxide layer over the cavity and over a bond area around the cavity on the substrate, (3) forming a reflective layer over the oxide layer, (4) forming a barrier layer over the reflective layer, (5) etching a portion of the barrier layer down to a portion of the reflective layer over the bond area, and (6) forming a solder layer on the portion of the reflective layer. In one embodiment, the reflective layer is a titanium-platinum-gold metal stack and the barrier layer is a titanium dioxide layer.

BRIEF DESCRIPTION OF THE DRAWINGS

Use of the same reference symbols in different figures indicates similar or identical items. The cross-sectional figures are not drawn to scale and are only for illustrative purposes.

DETAILED DESCRIPTION

Figure 1:
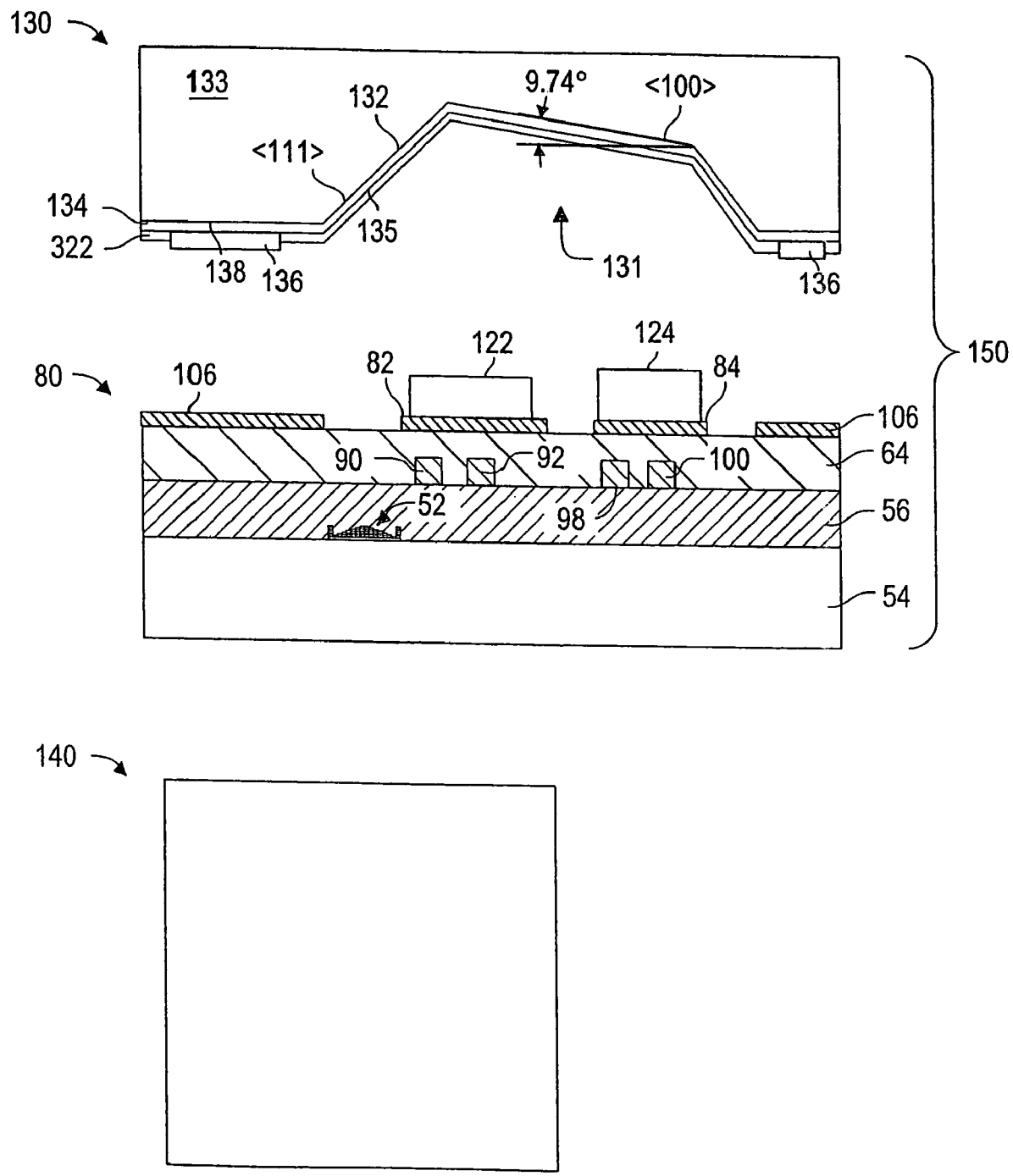
FIGS. 1 and 2 are cross-sections of a wafer-scale optoelectronic package in one embodiment of the invention.
Figure 2:
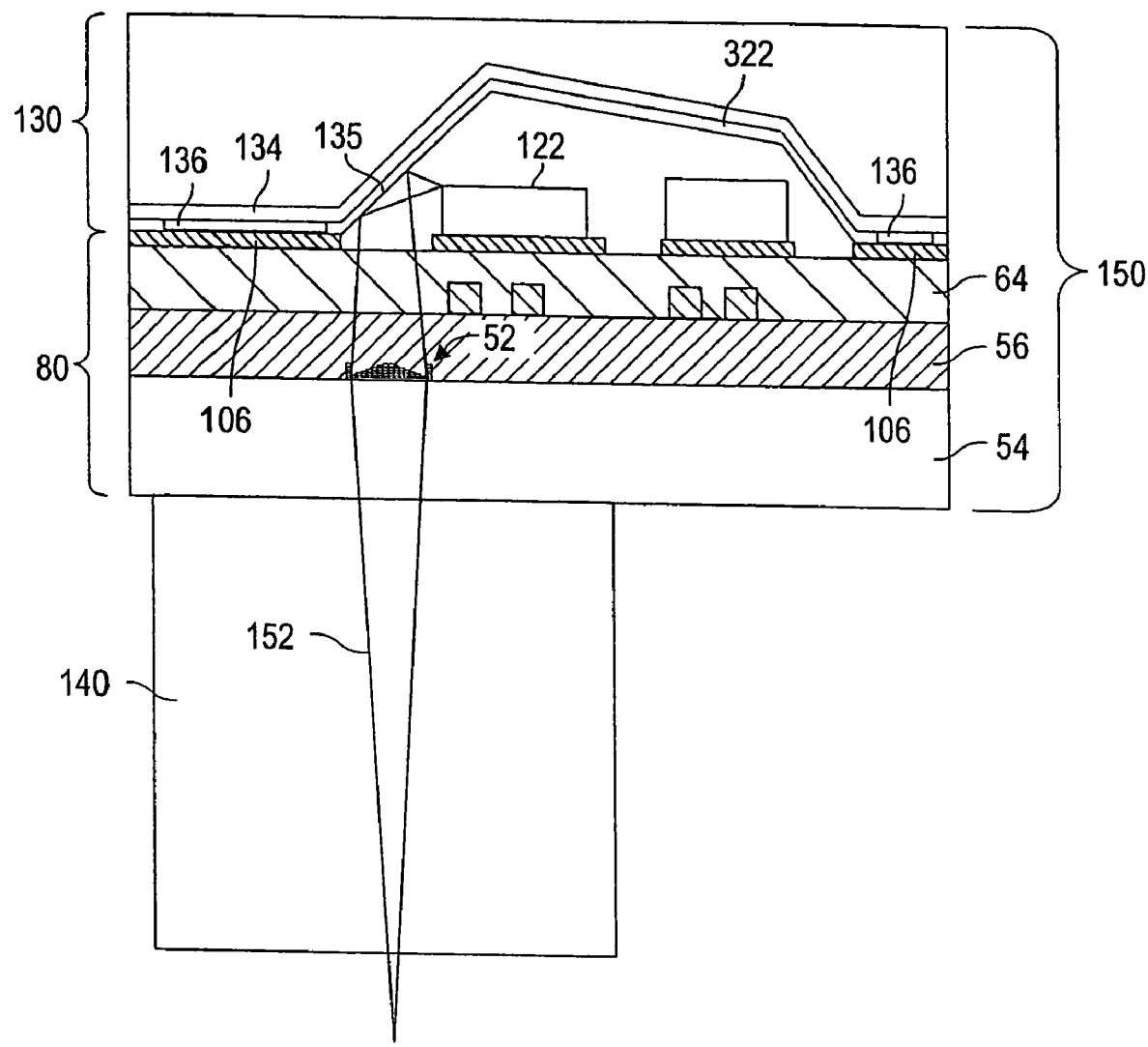
Figure 3:
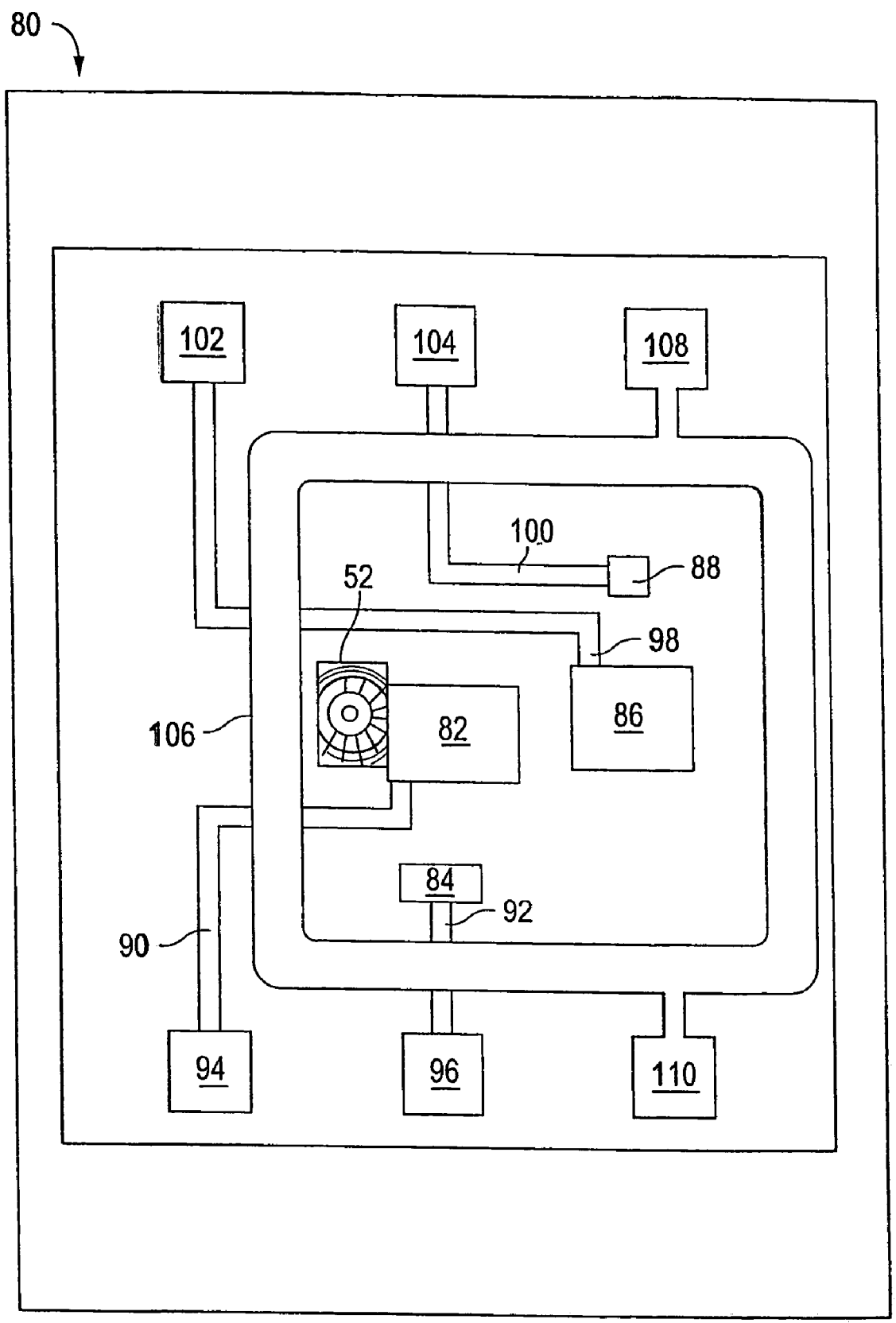
FIG. 3 is a top view of a sub-mount of the optoelectronic package of FIGS. 1 and 2 in one embodiment of the invention.

FIGS. 1, 2, and 3 illustrate a wafer-scale optoelectronic package 150 including a sub-mount 80 and a lid 130 in one embodiment of the invention. Sub-mount 80 includes an optical lens 52 formed atop a substrate 54 and covered by an oxide layer 56. Buried traces 90, 92, 98, and 100 are formed atop oxide layer 56 and covered by a dielectric layer 64. Contact pads 82, 84, 86, and 88 (all shown in FIG. 3) are connected by plugs to buried traces 90, 92, 98, and 100, which are themselves connected by plugs to contact pads 94, 96, 102 and 104 (shown in FIG. 3) located outside of a seal ring 106. A laser die 122 is bonded atop contact pad 82 and wire bonded to contact pad 84, and a monitor photodiode die 124 is bonded atop contact pad 86 and wire bonded to contact pad 88. Seal ring 106 is connected to contact pads 108 and 110 for grounding purposes.

Lid 130 includes a body 133 that defines a lid cavity 131 having a surface 132 covered by a reflective material 134. Lid cavity 131 provides the necessary space to accommodate the dies that are mounted on sub-mount 80. Reflective material 134 on surface 132 forms a 45 degree mirror 135 that reflects a light from laser die 122 to lens 52. A seal ring 136 is formed on the bond area along the edge of lid 130 around lid cavity 131. Reflective material 134 over lid cavity 131 also serves as an EMI shield when it is grounded through seal ring 136 and contact pads 108 and 110. In one embodiment, a barrier 322 is formed over reflective material 134 to define where seal ring 136 is to be formed. Barrier 322 confines seal ring 136 so the seal ring material (e.g., a solder) does not wick into cavity 131 and interfere with mirror 135.

In one embodiment, lid 130 has a (100) crystallographic plane oriented at a 9.74 degree offset from a major surface 138. Lid 130 is anisotropically etched so that surface 132 forms along a (111) crystallographic plane. As the (100) plane of lid 130 is oriented at a 9.74 degree offset from major surface 138, the (111) plane and mirror 135 are oriented at a 45 degree offset from major surface 138.

In one embodiment, an alignment post 140 is bonded to the backside of sub-mount 80. Alignment post 140 allows package 150 to be aligned with an optical fiber in a ferrule.

Figure 4:
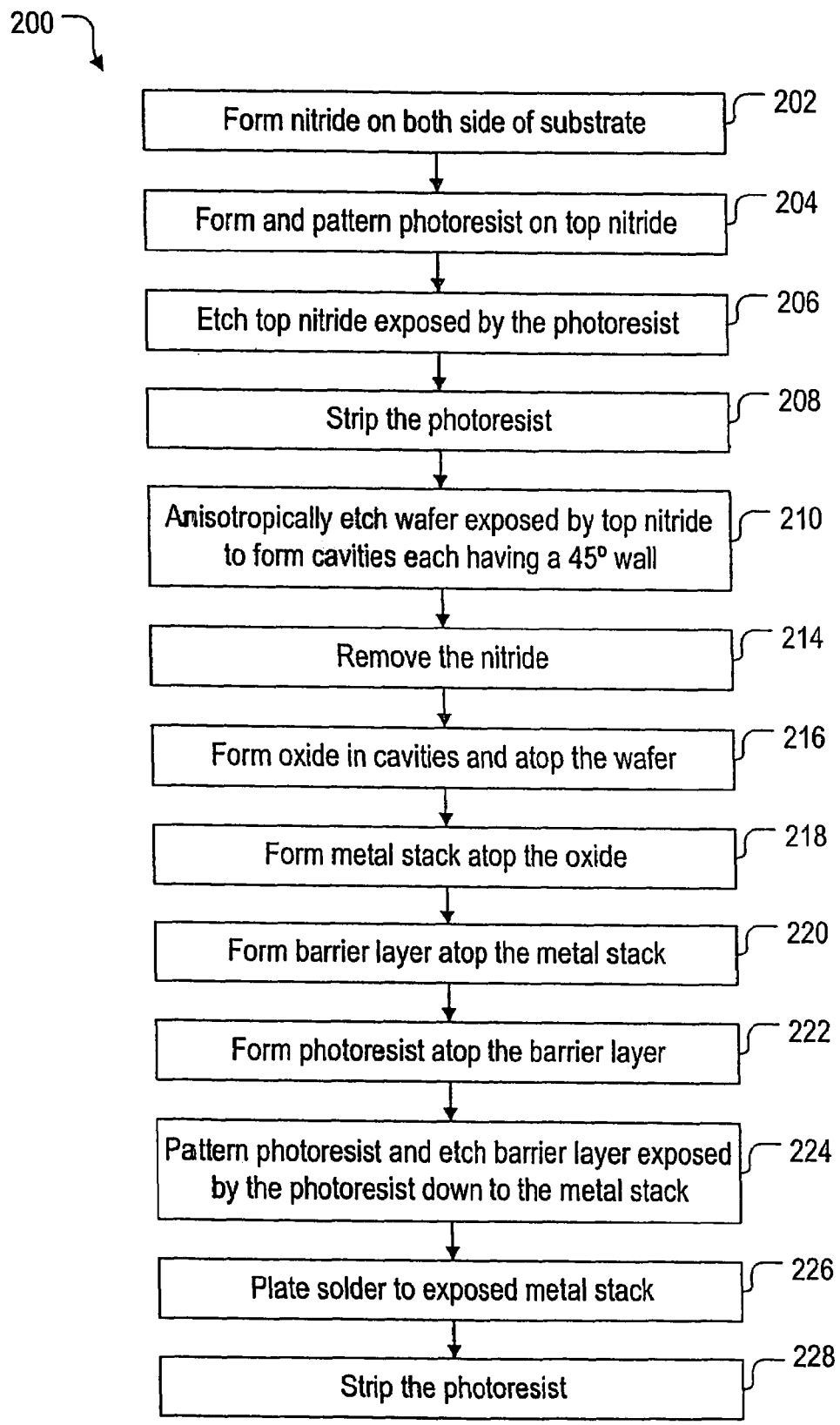
FIG. 4 is a flowchart of a method for making a lid for the wafer-scale optoelectronic package of FIGS. 1, 2, and 3 in one embodiment of the invention.

FIG. 4 illustrates a method 200 for forming a wafer-scale lid 130 in one embodiment of the invention.

Figure 5:
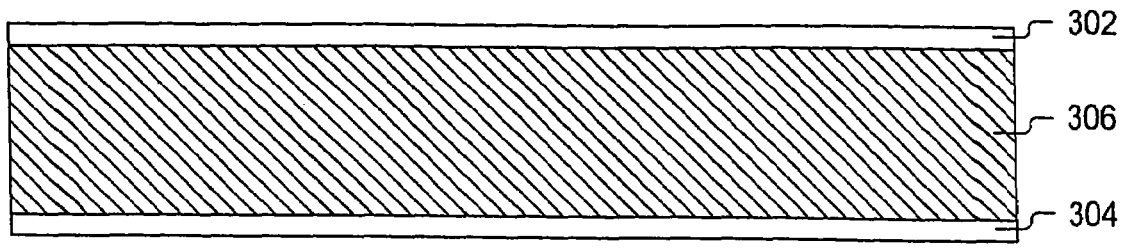
FIGS. 5, 6, 7, 8, 9A, 9B, 10, 11, 12, 13, 14, 15, and 16 are the structures formed by the method of FIG. 4 in one embodiment of the invention.

In step 202, as shown in FIG. 5, nitride layers 302 and 304 are formed on the top and the bottom surfaces of a substrate 306, respectively. In one embodiment, substrate 306 is silicon having a thickness of about 675 microns, and nitride layers 302 and 304 are silicon nitride ($SiN_4$) formed by low pressure chemical vapor deposition (LPCVD) and have a thickness of about 1000 to 2000 angstroms. In one embodiment, if adhesion of nitride layers 302 and 304 to a silicon substrate 306 becomes problematic, nitride layers 302 and 304 can be made low stress by modifying the gas ratio (dichlorosilante to ammonia) and the amount of gas flow. In one embodiment, if denser nitride layers 302 and 304 are needed to withstand a KOH etch, nitride layers 302 and 304 can be made silicon rich in order to become denser.

Figure 6:
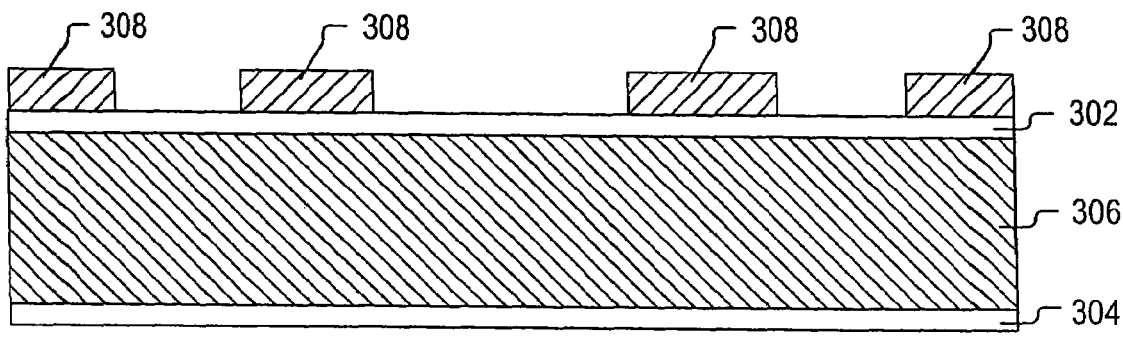

In step 204, as shown in FIG. 6, a photoresist 308 is next spun, exposed, and developed on nitride layer 302. FIG. 17 illustrate a mask 412 used in this lithographic process in one embodiment. Mask 412 includes lid cavity patterns 414 that define the shape of lid cavity 314B in FIGS. 9 to 16. In one embodiment, lid cavity patterns 414 are trapezoidal so that the sidewalls formed by the nonparallel sides are flat instead of stepped. Mask 412 also includes scribe line patterns 416 that define the separation cavities 314A and 314C in FIGS. 9A and 10 to 16. Scribe line patterns 416 are oriented along a direction on wafer 306 that provides a symmetric etch angle. Note that FIGS. 6 to 9A and 10 to 16 show the cross-section of the resulting structure formed by method 200 along lines AA' while FIG. 9B shows the cross-section of the resulting structure formed by method 200 along lines BB'.

Figure 7:
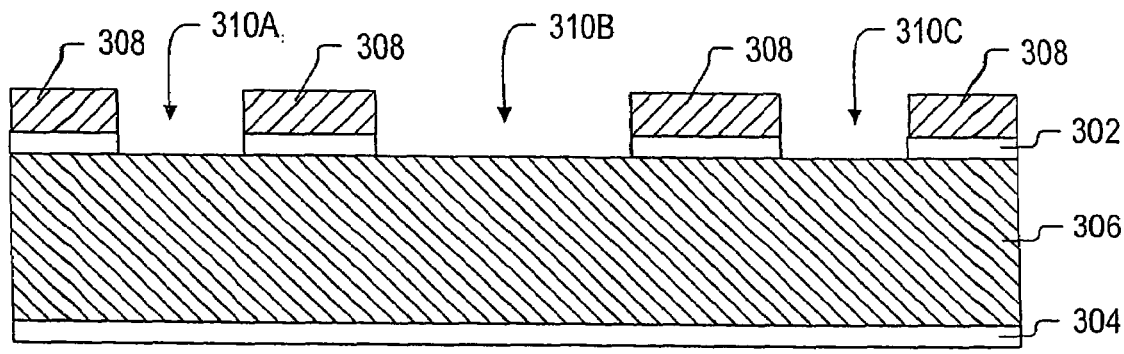

In step 206, as shown in FIG. 7, areas of nitride layer 302 exposed by windows 310A, 310B, and 310C in photoresist 308 are etched down to substrate 306. In one embodiment, nitride layer 302 is etched using a reactive ion etching (RIE)

process. The remaining portions of nitride layer 302 serve as a mask for an anisotropic etch.

Figure 8:
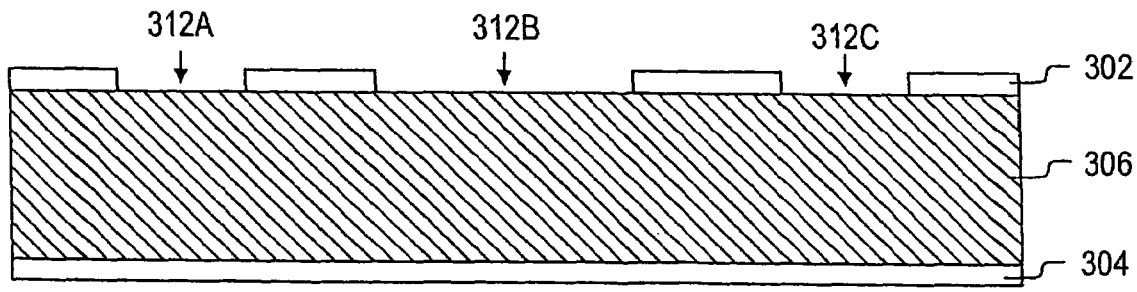

In step 208, as shown in FIG. 8, resist 308 is stripped. As can be seen, windows 312A, 312B, and 312C are formed in nitride layer 302. The dimensions of these windows and the space between them are application dependent.

Figure 9A:
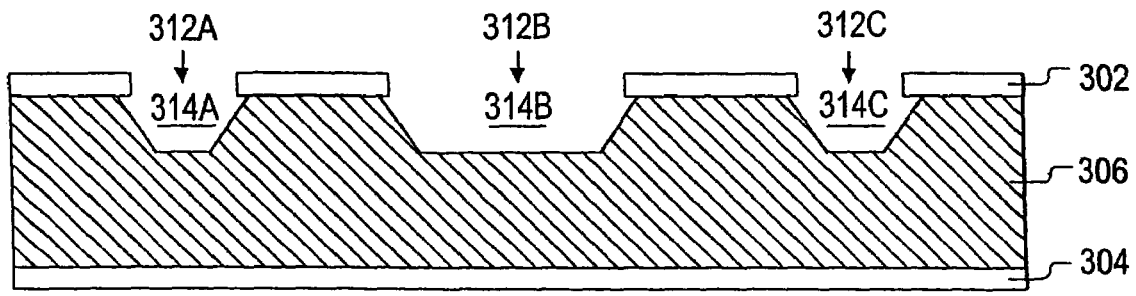
Figure 9B:
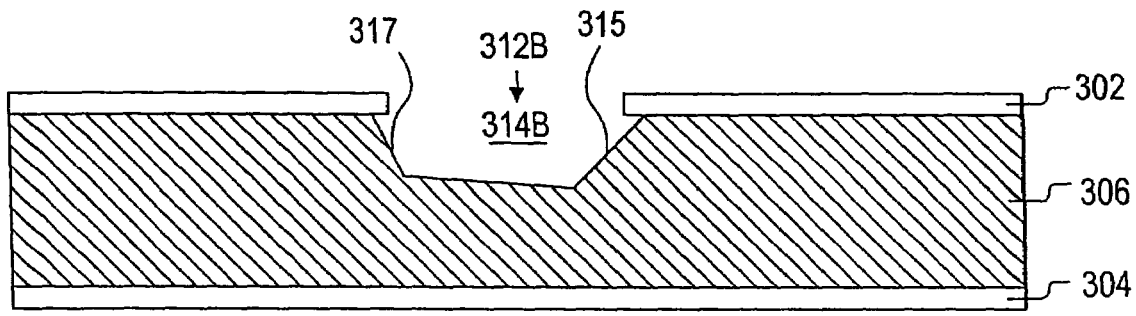

In step 210, as shown in FIG. 9A along line AA' and in FIG. 9B along line BB', areas of substrate 306 exposed by windows 312A to 312C in nitride layer 302 are etched to form separation cavities 314A and 314C, and lid cavity 314B. As can be seen in FIG. 9B, lid cavity 314B has a 45 degree wall 315 (which corresponds to surface 132 in FIG. 1) and a 64.48 degree wall 317. In one embodiment, silicon substrate 306 is anisotropically etched using a KOH solution having a (100) to (111) plane selectivity of 400 to 1. In one embodiment, each cavity is etched to 375 microns deep, which results in an undercut of 1 micron in nitride layer 302 due to the selectivity of the etchant.

Figure 10:
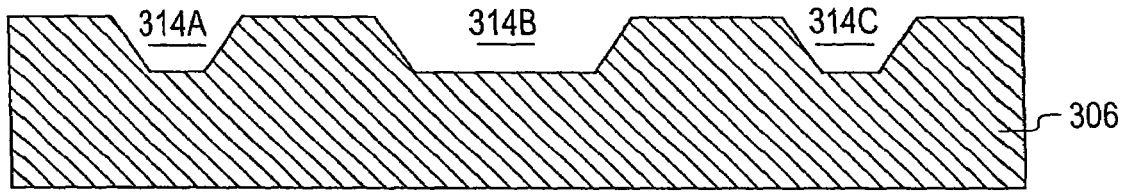

In step 214, as shown in FIG. 10, nitride layers 302 and 304 are removed. In one embodiment, nitride layers 302 and 304 are removed using a hot phosphoric wet etch.

Figure 11:
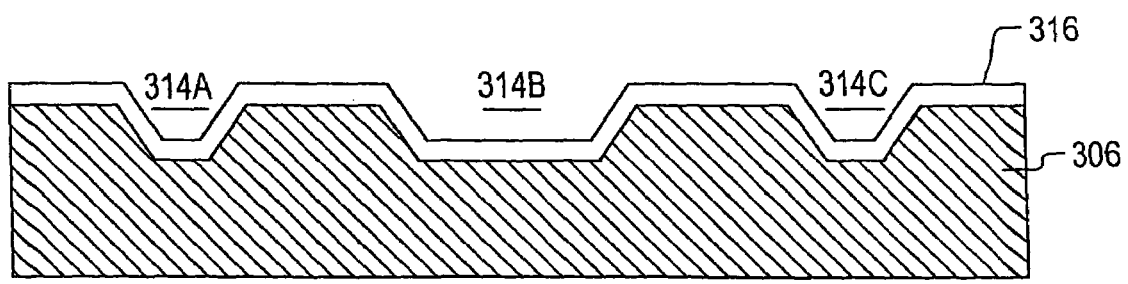

In step 216, as shown in FIG. 11, an oxide layer 316 is formed over cavities 314A, 314B, and 314C, and on the top surface of substrate 306. In one embodiment, oxide layer 316 is silicon dioxide that is thermally grown from silicon substrate 306 and has a thickness of about 1000 angstroms.

Figure 12:
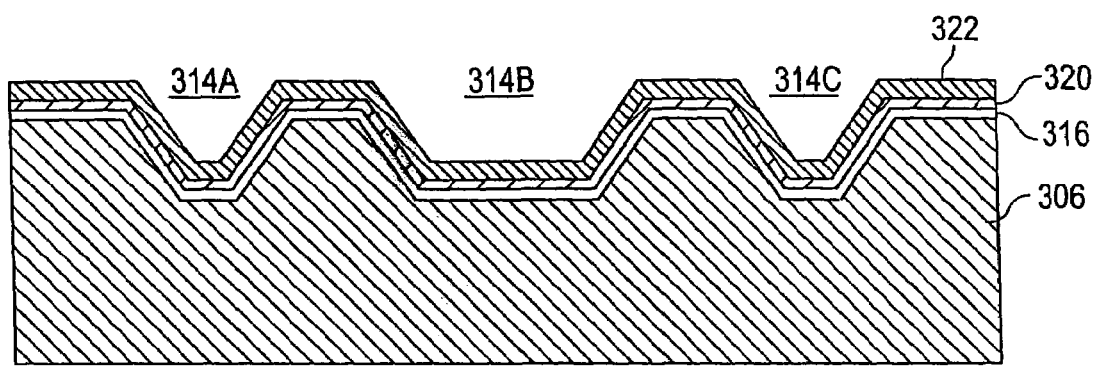

In step 218, as shown in FIG. 12, a reflective layer 320 is formed over oxide layer 316. In one embodiment, reflective layer 320 is a metal stack of a titanium-platinum-gold (TiPtAu) sequence deposited by e-beam evaporation or sputtering. In one embodiment, the titanium layer has a thickness of about 500 angstroms, the platinum layer atop the titanium layer has a thickness of about 1000 angstroms, and the gold layer atop the titanium has a thickness of about 1500 angstroms. Metal stack 320 is the reflective material 134 (FIG. 1) that forms mirror 135 (FIG. 1) on the (111) plane surface 132 (FIG. 1).

In step 220, as shown in FIG. 12, a barrier layer 322 is formed over reflective layer 320. In one embodiment, barrier layer 322 is a metal oxide formed over reflective layer 320. For example, barrier layer 322 is a titanium dioxide ($TiO_2$) layer that is thermally deposited upon the TiPtAu metal stack 320 and has a thickness about 500 angstroms. Alternatively, barrier layer 322 can be a nitride, a boride, a fluoride, a fluorocarbon, a polyimide, or any other material that can withstand the soldering temperatures without adhering to the solder. Furthermore, barrier layer 322 can be formed by other processes, including sputtering, reactive sputtering, chemical vapor deposition, and plasma enhanced chemical vapor deposition.

Figure 13:
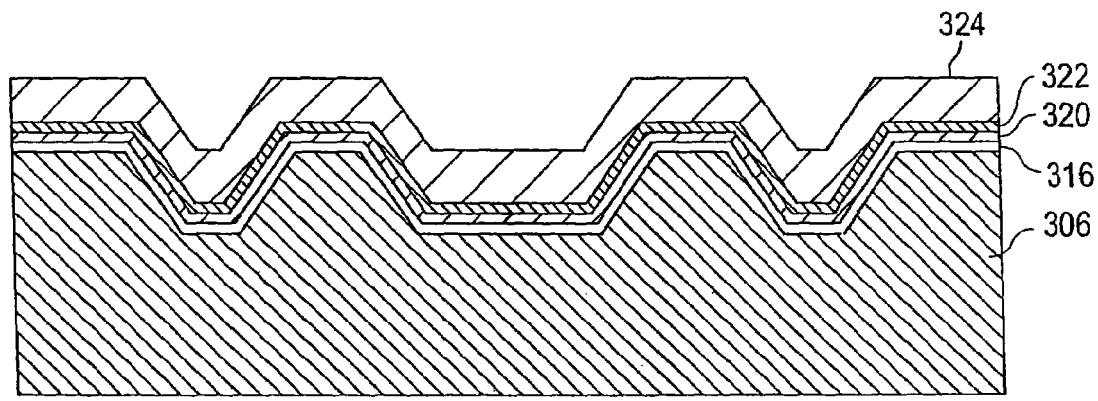

In step 222, as shown in FIG. 13, a photoresist 324 is next deposited on (e.g., spun on or sprayed on) barrier layer 322.

Figure 14:
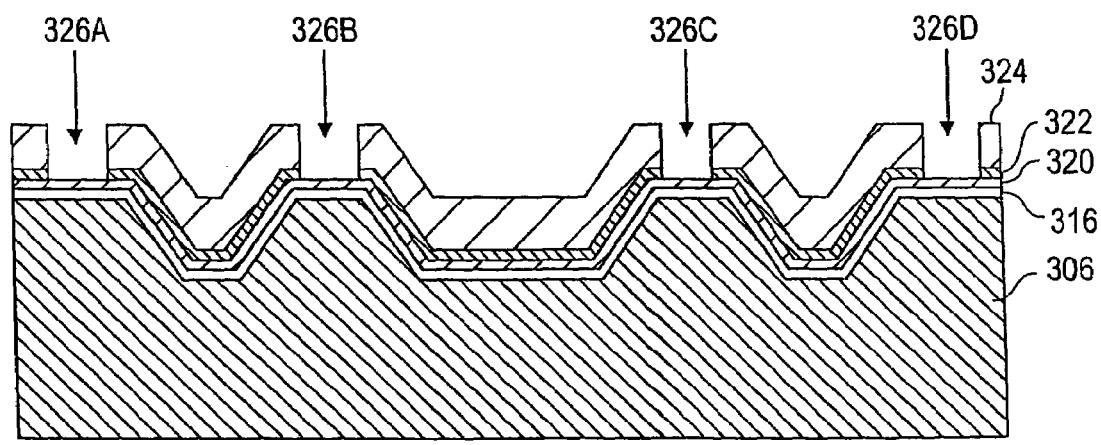

In step 224, as shown in FIG. 14, photoresist 324 is exposed and developed to form windows 326A, 326B, 326C, and 326D. Areas of barrier layer 322 exposed by windows 326A to 326D are etched down to reflective layer 320. In one embodiment, a titanium dioxide barrier layer 322 is etched using a solution of diluted HF (1000:1) and nitric acid (100:1).

Figure 15:
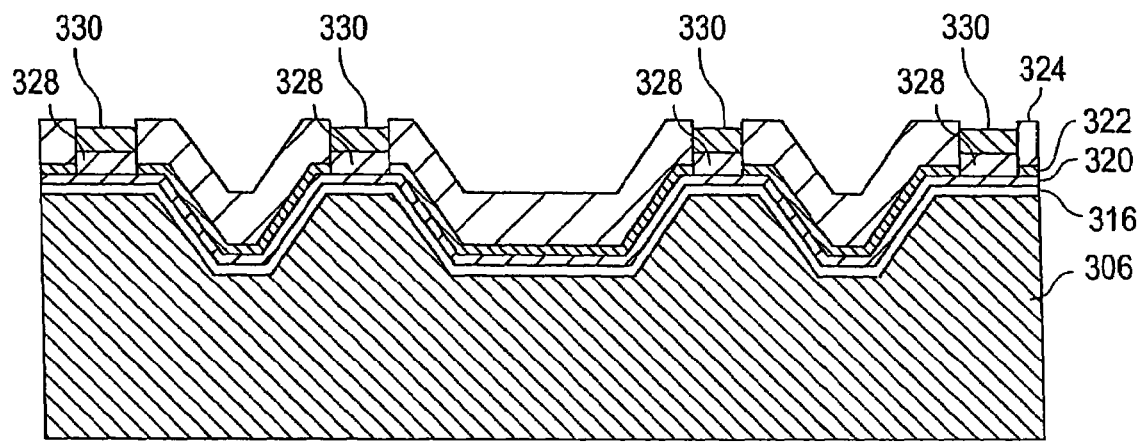

In step 226, as shown in FIG. 15, a solder is plated through windows 326A to 326D onto reflective layer 320. The solder forms seal ring 136 (FIGS. 1 and 2) on the bond area around lid cavity 314B (also shown as lid cavity 131 in FIG. 1). In one embodiment, the solder is a gold-tin (AuSn) solder including a gold layer 328 having a thickness of 18,500 angstroms, and a tin layer 330 having a thickness of 18,500 angstroms on top of gold layer 328. In one embodiment, photoresist 324 is stripped, reapplied, and patterned again to form windows 326A to 326D prior to plating the solder. This is because the gold plating (on the bottom) may mushroom over the top of the initial resist for gold plating. Therefore, in order to get somewhat vertical edges, it may be necessary to remove the original resist and reapply a thicker resist that will provide a form for the solder plating.

Figure 16:
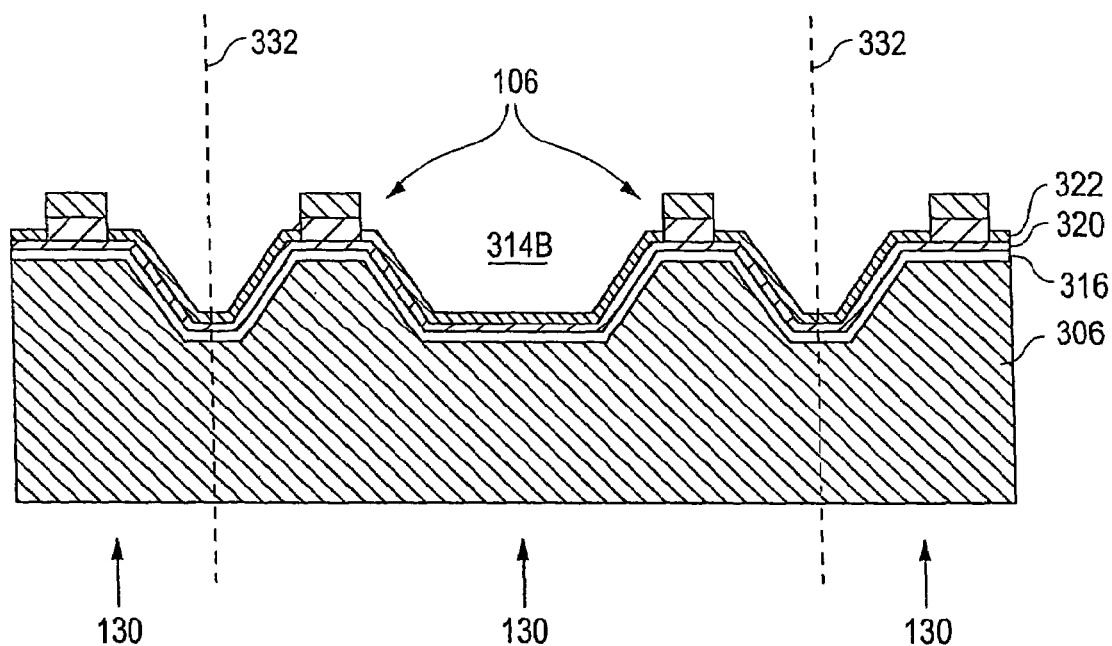
Figure 17:
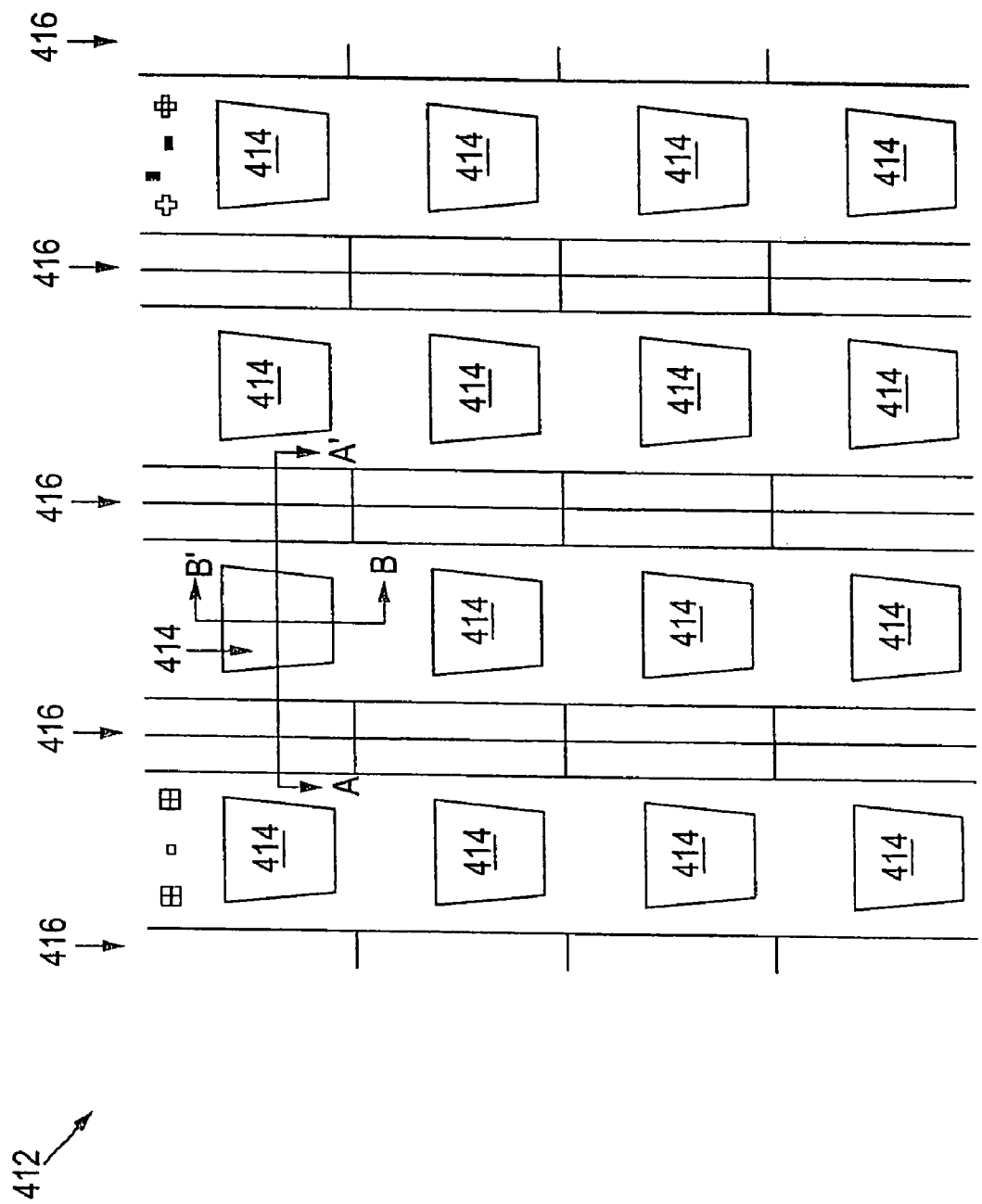
FIG. 17 is a mask used in the method of FIG. 1 in one embodiment of the invention.

In step 228, as shown in FIG. 16, photoresist 324 is stripped and lid 130 can now be singulated from adjacent lids 130 (shown partially) along imaginary lines 332.

Figure 18:
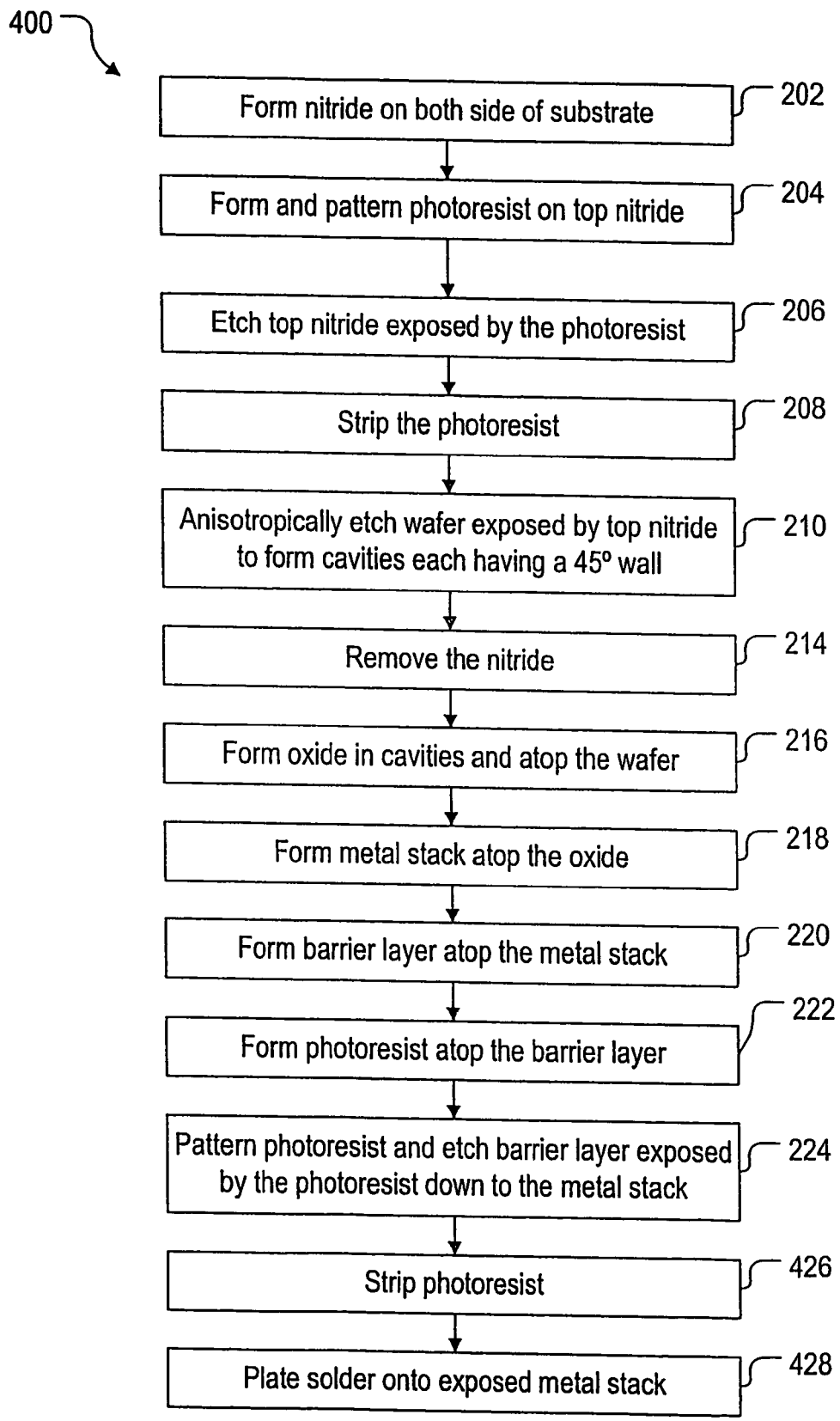
FIG. 18 is a flowchart of a method for making a lid for the wafer-scale optoelectronic package of FIGS. 1, 2, and 3 in another embodiment of the invention.

FIG. 18 illustrates a method 400 for forming a wafer-scale lid 130 in another embodiment of the invention. As can be seen, method 400 is similar to method 200 except that steps 426 and 428 have replaced steps 226 and 228.

Figure 19:
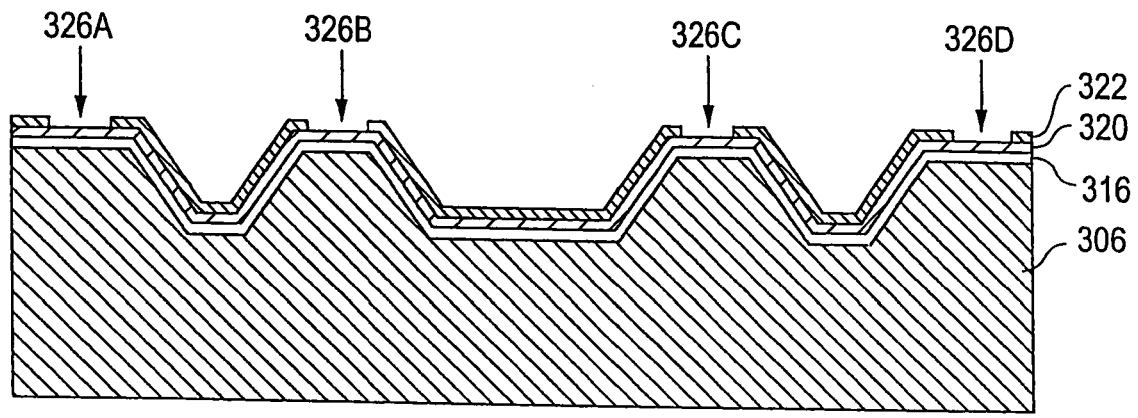
FIGS. 19 and 20 are the structures formed by the method of FIG. 18 in one embodiment of the invention.

In step 426, as shown in FIG. 19, photoresist 324 is stripped. This leaves barrier layer 322 as the mask during the solder plating.

Figure 20:
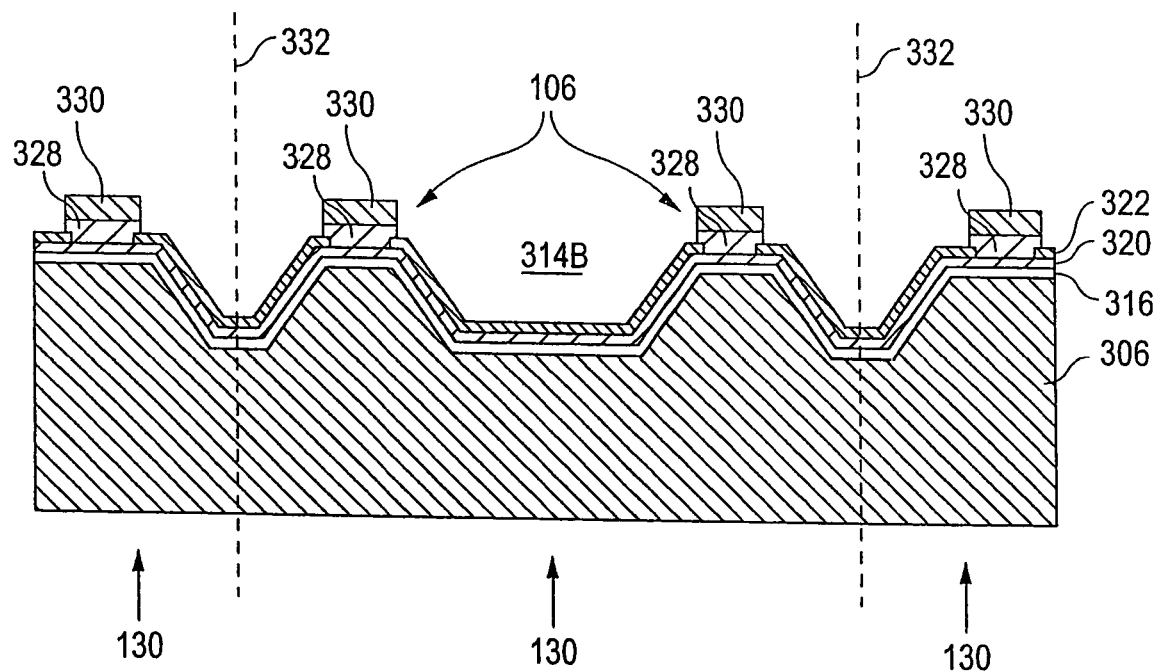

In step 428, as shown in FIG. 20, a solder including gold layer 328 and tin layer 330 are plated through windows 326A to 326D (defined now by barrier layer 322) onto reflective layer 320. Again, lid 130 can be singulated from adjacent lids 130 (shown partially) along imaginary lines 332.

In method 200, photoresist 324 is left on as a mask during the solder plating. In method 400, photoresist 324 is stripped and barrier layer 322 is used as the mask during the solder plating. The advantage of method 400 is that photoresist 324 does not have to be a thick resist. In addition, the uniformity of photoresist coverage is unimportant. Note that the solder and the resulting seal ring 136 will experience a small amount of mushrooming because the solder grows vertically by about the same amount that it grows laterally. In one embodiment, the total plating thickness is about 3 microns so the lateral growth is not problematic.

As described above, $TiO_2$ may be used as the barrier layer. $TiO_2$ makes a particularly good barrier layer in the present application for many reasons. First, the AuSn solder will not adhere to it. Second, it adheres well to gold in the metal stack while not many materials do. Third, although it has a high refractive index, which can alter the reflective of the gold, it is possible to deposit a very thin layer (e.g., much less than a quarter wavelength). At this thickness, there should be little effect on light transmission through the lid. Another advantage is that the methods described require only one mask after the cavity etch. This provides a great cost advantage over other methods that often require up to three masks after the cavity etch.

Although $TiO_2$ has been disclosed as a material for the barrier layer, other materials having the following characteristics can also be used: (1) good adherence to the mirror (i.e., the reflective layer); (2) non-wetable to solder; (3) transparent to light; and (4) non-soluble in the plating solution.

Furthermore, the barrier layer does not have to be thin (e.g., less than a quarter wavelength). In some applications, it is advantageous to have a thick barrier layer. As the barrier layer gets to a geometric thickness (angle dependent) near a quarter wave length, substantial changes in reflectance will become evident. These can either be more or less reflective. If the laser is collimated, these interference effects can be exploited to improve the reflectivity of the mirror. However, if the laser is not collimated, the wide range of angles of the light will cause a variable reflectance across the mirror depending on the local angle, resulting in variable intensity of the beam when it leaves the mirror.

Various other adaptations and combinations of features of the embodiments disclosed are within the scope of the invention. Numerous embodiments are encompassed by the following claims.

What is claimed is:

1. A method for forming a lid for a wafer-scale package, comprising:
    forming a lid cavity having an angled sidewall in a substrate;
    forming an oxide layer on the substrate over the lid cavity and over a bond area around the lid cavity;
    forming a reflective layer on the oxide layer, a portion of the reflective layer over the angled sidewall forming a mirror on the angled sidewall for reflecting a light;
    forming a barrier layer on the reflective layer, the barrier layer being solder-nonwettable, the barrier layer having a thickness less than a quarter wavelength of the light and being transparent to the light;
    etching a portion of the barrier layer down to the reflective layer over the bond area; and
    forming a solder layer on the reflective layer within the etched portion of the barrier layer over the bond area, wherein the barrier layer prevents the solder layer from wicking into the lid cavity and affecting said reflecting.

2. The method of claim 1, wherein said forming a lid cavity in the substrate comprises anisotropically etching the substrate to form the lid cavity, the substrate comprising a first crystallographic plane at an offset from a wafer top surface and the angled sidewall being along a second crystallographic plane.

3. The method of claim 2, wherein the first crystallographic plane is oriented so that the second crystallographic plane is oriented 45° from a normal to the wafer top surface and said anisotropic etching comprises a wet etch using a KOH solution.

4. The method of claim 1, wherein said forming an oxide layer comprises thermally growing the oxide layer.

5. The method of claim 1, wherein said forming a reflective layer comprises forming a metal stack layer.

6. The method of claim 5, wherein said forming a barrier layer comprises thermally depositing a metal oxide layer upon the metal stack layer.

7. The method of claim 6, wherein the metal stack layer comprises a titanium layer, a platinum layer atop the titanium layer, and a gold layer atop the platinum layer, and the metal oxide layer comprises a titanium dioxide layer.

8. The method of claim 7, wherein said etching a portion of the baffler layer comprises a wet etch using a diluted HF and nitric acid solution.

9. The method of claim 5, wherein said forming a barrier layer comprises a method selected from the group consisting of thermally depositing, sputtering, reactive sputtering, chemical vapor deposition, and plasma enhanced chemical vapor deposition.

10. The method of claim 9, wherein the baffler layer is selected from the group consisting of nitride, boride, fluoride, fluorocarbon, and polyimide.

11. The method of claim 1, wherein said forming a solder layer comprises plating the solder layer on the portion of the reflective layer.

12. The method of claim 1, wherein said etching a portion of the barrier layer comprises:
    patterning a photoresist layer over the barrier layer to form a window over the portion of the baffler layer; and
    etching the portion of the barrier layer exposed by the window.

13. The method of claim 12, further comprising stripping the photoresist after said forming the solder layer on the portion of the reflective layer.

14. The method of clam 12, further comprising stripping the photoresist prior to said forming the solder layer on the portion of the reflective layer.

15. The method of claim 1, wherein said solder layer comprises a gold-tin solder.

16. The method of claim 1, wherein the light is collimated.

17. The method of claim 1, wherein the lid cavity of the lid for a wafer-scale package forms a space to accommodate a plurality of dies.

18. The method of claim 1, further comprising forming a wafer of a plurality of lids for wafer-scale optoelectronic packages.

* * * * *

UNITED STATES PATENT AND TRADEMARK OFFICE
CERTIFICATE OF CORRECTION

PATENT NO. : 7,534,636 B2
APPLICATION NO. : 11/097534
DATED : May 19, 2009
INVENTOR(S) : Kendra Gallup et al.

It is certified that error appears in the above-identified patent and that said Letters Patent is hereby corrected as shown below:

Column 6, Line 4, Claim 8, delete "baffler" and insert --barrier--.

Column 6, Line 11, Claim 10, delete "baffler" and insert --barrier--.

Column 6, Line 20 (Approx.), Claim 12, delete "baffler" and insert --barrier--.

Signed and Sealed this
Twenty-fifth Day of September, 2012

David J. Kappos
*Director of the United States Patent and Trademark Office*